(12) United States Patent
Sharma et al.

(10) Patent No.: US 12,183,668 B2
(45) Date of Patent: Dec. 31, 2024

(54) THIN-FILM TRANSISTORS AND MIM CAPACITORS IN EXCLUSION ZONES

(71) Applicant: Intel Corporation, Santa Clara, CA (US)

(72) Inventors: Abhishek A. Sharma, Hillsboro, OR (US); Willy Rachmady, Beaverton, OR (US); Cheng-Ying Huang, Portland, OR (US); Gilbert Dewey, Beaverton, OR (US); Rajat Paul, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 770 days.

(21) Appl. No.: 17/213,144

(22) Filed: Mar. 25, 2021

(65) Prior Publication Data

US 2022/0310610 A1 Sep. 29, 2022

(51) Int. Cl.
*H01L 23/522* (2006.01)
*H01L 27/01* (2006.01)
*H01L 29/786* (2006.01)
*H01L 49/02* (2006.01)
*H10B 12/00* (2023.01)

(52) U.S. Cl.
CPC ...... *H01L 23/5223* (2013.01); *H01L 23/5226* (2013.01); *H01L 27/016* (2013.01); *H01L 28/91* (2013.01); *H01L 29/786* (2013.01); *H10B 12/30* (2023.02)

(58) Field of Classification Search
CPC . H01L 23/481; H01L 23/522; H01L 23/5223; H01L 23/5226; H01L 27/016; H01L 27/1207; H01L 28/40; H01L 28/60; H01L 28/90; H01L 28/91; H01L 29/786; H01L 29/7869; H01L 29/78696; H10B 12/02; H10B 12/05; H10B 12/30; H10B 12/315
See application file for complete search history.

(56) References Cited

U.S. PATENT DOCUMENTS

| | | | |
|---|---|---|---|
| 2012/0292741 A1* | 11/2012 | Dalton | H01L 21/76816 257/536 |
| 2017/0162105 A1* | 6/2017 | Kim | H01L 28/20 |
| 2020/0135930 A1* | 4/2020 | Passlack | H01L 29/78648 |
| 2020/0312839 A1* | 10/2020 | Majhi | H01L 27/0605 |
| 2021/0408021 A1* | 12/2021 | Young | G11C 11/2275 |

* cited by examiner

*Primary Examiner* — Cheung Lee
(74) *Attorney, Agent, or Firm* — Schwabe, Williamson & Wyatt P.C.

(57) ABSTRACT

Thin-film transistors and MIM capacitors in exclusion zones are described. In an example, an integrated circuit structure includes a semiconductor substrate having a zone with metal oxide semiconductor (MOS) transistors therein, and having a zone that excludes MOS transistors. A back-end-of-line (BEOL) structure is above the semiconductor substrate. A thin-film transistor (TFT) and/or a metal-insulator-metal (MIM) capacitor is in the BEOL structure. The TFT and/or MIM capacitor is vertically over the zone that excludes MOS transistors.

24 Claims, 14 Drawing Sheets

THIN-FILM TRANSISTORS AND MIM CAPACITORS IN EXCLUSION ZONES

TECHNICAL FIELD

Embodiments of the disclosure are in the field of integrated circuit (IC) structures and, in particular, thin-film transistors (TFTs) and metal-insulator-metal (MIM) capacitors in exclusion zones.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of IC devices, multi-gate transistors, such as tri-gate transistors, have become more prevalent as device dimensions continue to scale down. In conventional processes, tri-gate transistors are generally fabricated on either bulk silicon substrates or silicon-on-insulator (SOI) substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller subthreshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
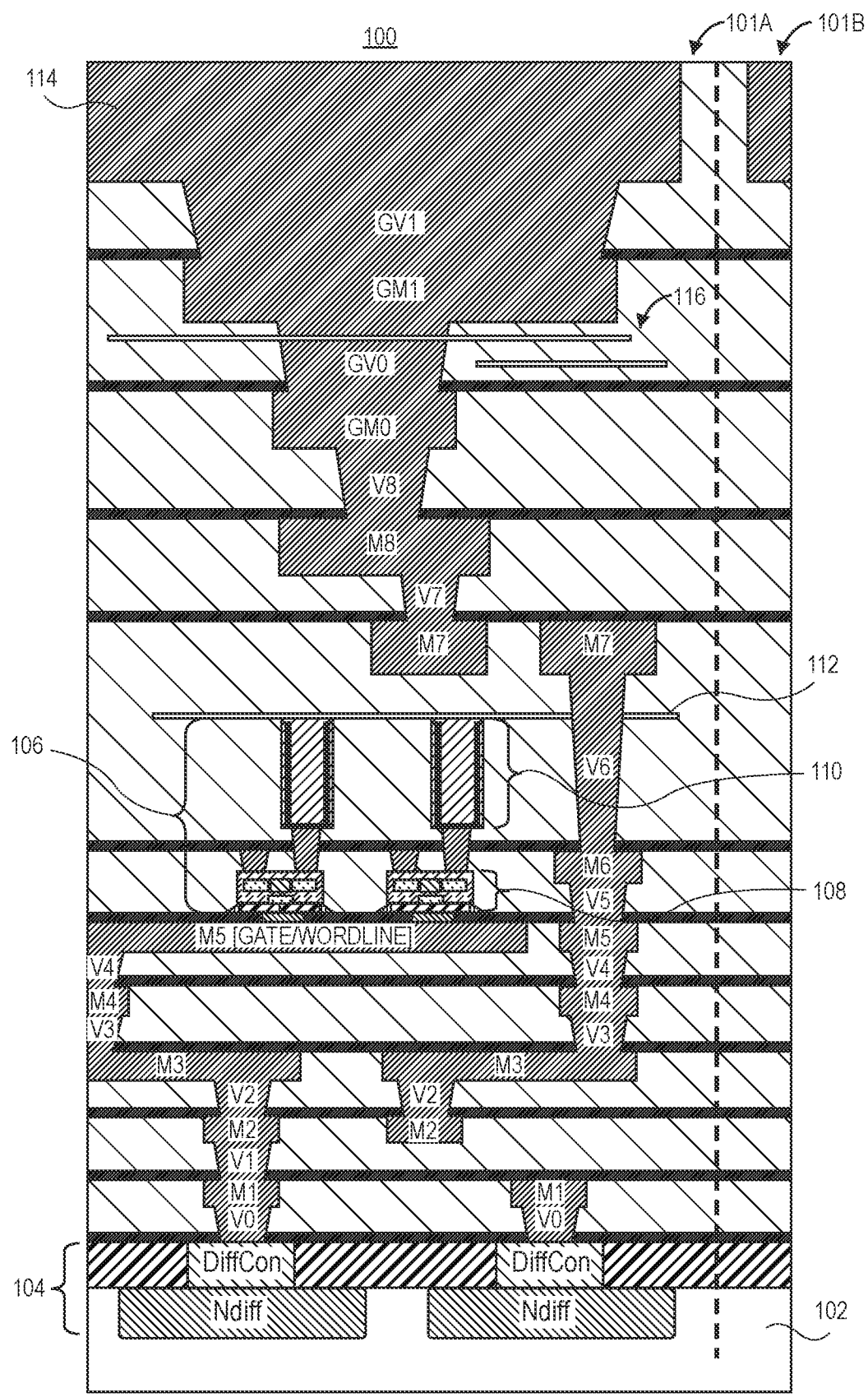
FIG. 1A illustrates a cross-sectional view of an integrated circuit (IC) structure that does not include a thin-film transistor (TFT) or a metal-insulator-metal (MIM) capacitor in an exclusion zone.

Thin-film transistors (TFTs) and/or metal-insulator-metal MIM capacitors in exclusion zones are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating BEOL thin-film transistors (TFTs) and/or metal-insulator-metal (MIM) capacitors in exclusion zones. One or more embodiments are directed to back-end (BE) layer transferred transistors for MIM banking. Embodiments may be implemented for use in, e.g., embedded DRAM (eDRAM) applications. Embodiments may include or pertain to one or more of back-end transistors, semiconducting oxide materials, TFTs, and system-on-chip (SoC) technologies. One or more embodiments may be implemented to realize high performance back-end transistors to potentially increase monolithic integration of back-end logic plus memory in SoCs of future technology nodes.

To provide context, state-of-the-art MIM capacitors are included in the backend. Banking of MIM capacitors is normally performed through front-end transistors which can be relatively slow. There is a need for fast access to charge. Some approaches have involved introducing capacitors in a substrate. Backend transistors open up a new opportunity to be incorporated in the backend as reconfigurable interconnects.

As an exemplary reference structure, FIG. 1A illustrates a cross-sectional view of an integrated circuit (IC) structure that does not include a TFT or a MIM capacitor in an exclusion zone.

Referring to FIG. 1A, an integrated circuit (IC) structure 100 includes an active zone 101A and a keep out zone or exclusion zone 101B (a separation for which is indicated by the dashed line). The IC structure 100 includes a substrate 102 having a device layer 104 with active devices in the device region 101A. Devices can include, e.g., N-diffusion (Ndiff) regions with corresponding diffusion contacts (DifCon). A back-end-of-line (BEOL) structure includes metal lines (e.g., M1-M8) and corresponding vias (e.g., V0-V8). Ground metal planes (e.g., GM0-GM1) and corresponding vias (e.g., GV0-GV1) are included above the metal lines (e.g., M1-M8) and corresponding vias (e.g., V0-V8). A metal bump 114, such as a C4 bump, is coupled to the top ground metal via (e.g., GV1). As depicted, the BEOL layers of the active zone 101A can include a region 106 with thin film transistors 108, trench MIM capacitors 110, and a coupling line 112. In the particular example shown, the region 106 is above a metal 5 (M5) line which acts as a gate/wordline. A plate MIM capacitor 116 may be included in upper layers of the BEOL layers of the active zone 101A, as is depicted. The keep out zone or exclusion zone 101B can include a through silicon via (TSV), not shown.

In accordance with one or more embodiments described herein, MIM capacitors connected to backend transistors are used for MIM banking. In an embodiment, parallel backend transistors are used to provide rush current and instantaneous charge. In an embodiment, backend transistors are sandwiched between metal layers. In an embodiment, in order to minimize area consumption and routing decongestion, reuse of a keep out zone (KOZ) region (e.g., where no other devices are included due to stress constraints) is implemented to create MIM banks. In accordance with one or more embodiments of the present disclosure, special MIMs are fabricated either in the BEOL as DRAM technology or in the Si substrate of any suitable shape. In an embodiment, the shape of MIM can be cylindrical or NAND-like.

Figure 1B:
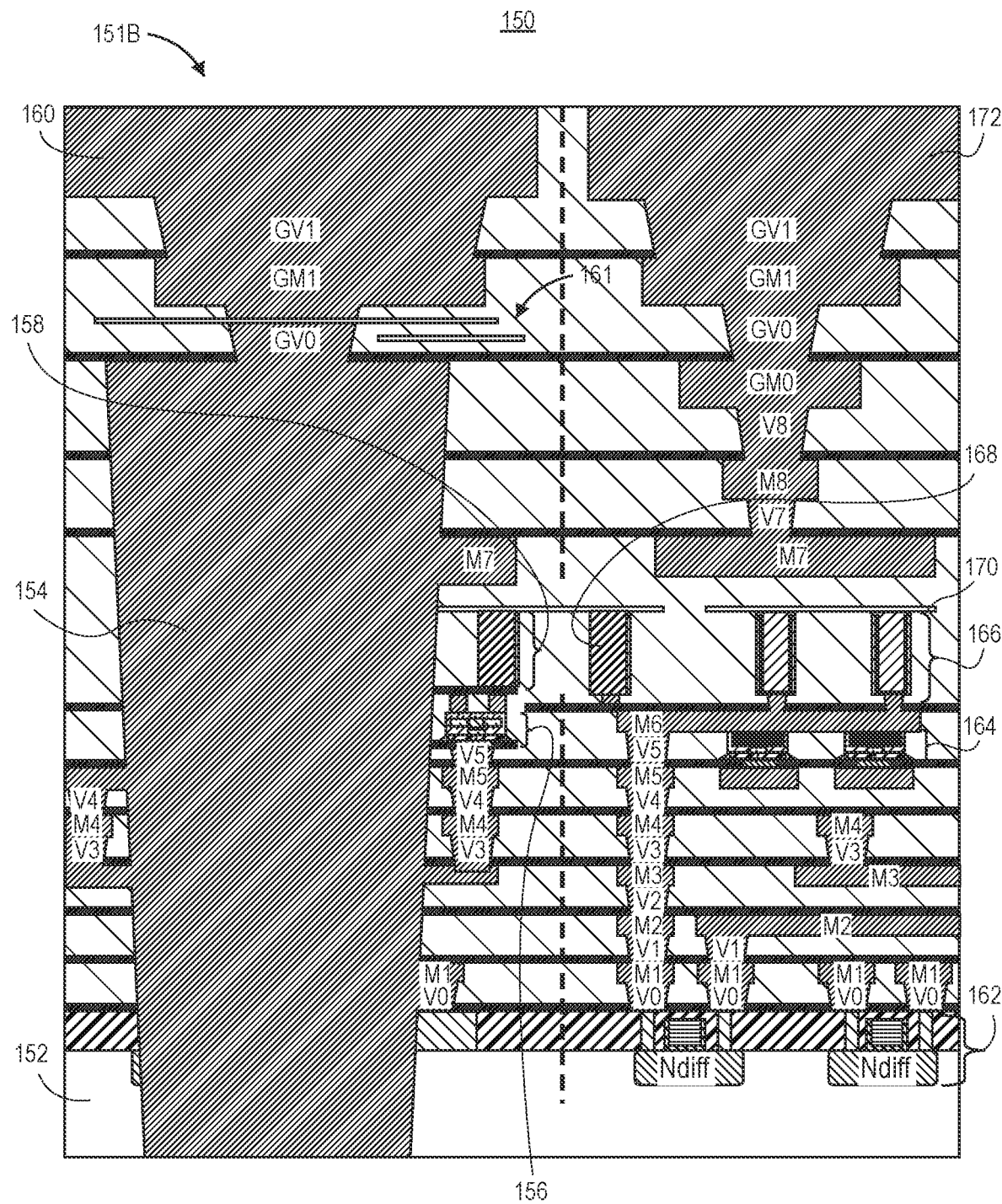
FIG. 1B illustrates a cross-sectional view of an integrated circuit (IC) structure that includes a (TFT) and a MIM capacitor in an exclusion zone, in accordance with an embodiment of the present disclosure.
Figure 1C:
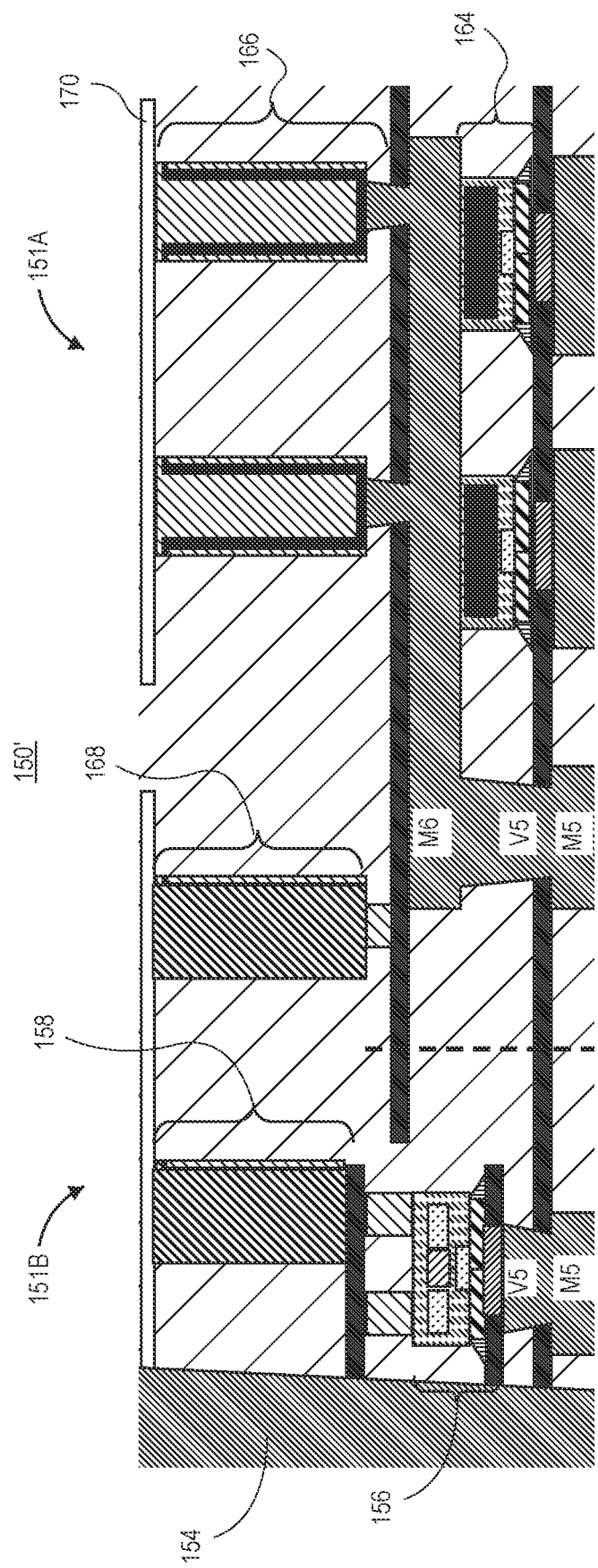
FIG. 1C illustrates an expanded view of a portion of the integrated circuit (IC) structure of FIG. 1B, in accordance with an embodiment of the present disclosure.

As an exemplary structure including devices in a KOZ, FIG. 1B illustrates a cross-sectional view of an IC structure 150 that includes a TFT and a MIM capacitor in an exclusion zone, in accordance with an embodiment of the present disclosure. FIG. 1C illustrates an expanded view 150' of a portion of the IC structure of FIG. 1B.

Referring to FIGS. 1B and 1C, an integrated circuit (IC) structure 150 (or 150') includes an active zone 151A and a keep out zone or exclusion zone 151B (a separation for which is indicated by the dashed line). The IC structure 150 (or 150') includes a substrate 152 having a device layer 162 with active devices in the device region 151A. Such front-end-of-line (FEOL) devices can include, e.g., N-diffusion (Ndiff) regions with corresponding diffusion contacts. A back-end-of-line (BEOL) structure is in both the active zone 151A and the keep out zone or exclusion zone 151B and can include metal lines (e.g., M1-M8) and corresponding vias (e.g., V0-V8). Ground metal planes (e.g., GM0-GM1) and corresponding vias (e.g., GV0-GV1) are included above the metal lines (e.g., M1-M8) and corresponding vias (e.g., V0-V8). A metal bump 160, such as a C4 bump, is coupled to the top ground metal via (e.g., GV1) in the keep out zone or exclusion zone 151B. A metal bump 172, such as a C4 bump, is coupled to the top ground metal via (e.g., GV1) in the active zone 151A.

As depicted, the BEOL layers of the active zone 151A can include a region with thin film transistors 164, trench MIM capacitors 166 and/or 168, and a coupling line 170. The BEOL layers of the keep out zone or exclusion zone 151B can include a region with TFTs 156 and trench MIM capacitors 158. A plate MIM capacitor 161 may be included in upper layers of the BEOL layers of the keep out zone or exclusion zone 151B, as is depicted. The keep out zone or exclusion zone 101B can include a through-silicon via (TSV) 154, as is depicted.

With reference again to FIGS. 1B and 1C, an IC structure 150 (or 150') includes a semiconductor substrate 152 having a zone 151A with metal oxide semiconductor (MOS) transistors 162 therein, and having a zone 151B that excludes MOS transistors. A back end of line (BEOL) structure is above the semiconductor substrate 152. A TFT 156 and/or a MIM capacitor 158 is in the BEOL structure. The TFT 156 and/or MIM capacitor 158 is vertically over the zone 151B that excludes MOS transistors.

In an embodiment, the zone 151A that excludes MOS transistors is a KOZ. In an embodiment, the integrated circuit (IC) structure 150 (or 150'), further includes a through-silicon via (TSV) structure 154 extending through the BEOL structure and the semiconductor substrate 152. The TSV structure 154 is in the zone 151B that excludes MOS transistors. In one such embodiment, the TFT 156 is laterally spaced apart from the TSV structure by a distance of 10 microns or less. In another such embodiment, the MIM capacitor 158 is laterally spaced apart from the TSV structure by a distance of 10 microns or less.

In an embodiment, the integrated circuit (IC structure 150 (or 150') includes both the TFT 156 and the MIM capacitor 158. In one such embodiment, the MIM capacitor 158 is coupled to the TFT 156, e.g., to form a 1T-1C memory device. In an embodiment, the MIM capacitor 158 has a cylindrical geometry.

In another aspect, there is increased need for advanced SoCs to include monolithically integrated BEOL transistors for logic functionality at higher metal layers. Such BEOL transistors typically have a lower thermal budget than front-end transistors due to increased thermal sensitivity of back-end materials. Also, the performance of such transistors may be severely hampered due to low channel mobility for BEOL-compatible channel materials such as IGZO (indium gallium zinc oxide).

In accordance with one or more embodiments described herein, non-planar BEOL-compatible TFTs are fabricated by effectively increasing the transistor width (and hence the drive strength and performance) for a given projected area. A TFT fabricated using such an architecture may exhibit an increase in gate control, stability, and performance of TFTs. Applications of such systems may include, but are not limited to, BEOL logic, memory, or analog applications. Embodiments described herein may include non-planar structures that effectively increase transistor width (relative to a planar device) by integrating the devices in unique architectures.

Figure 2A:
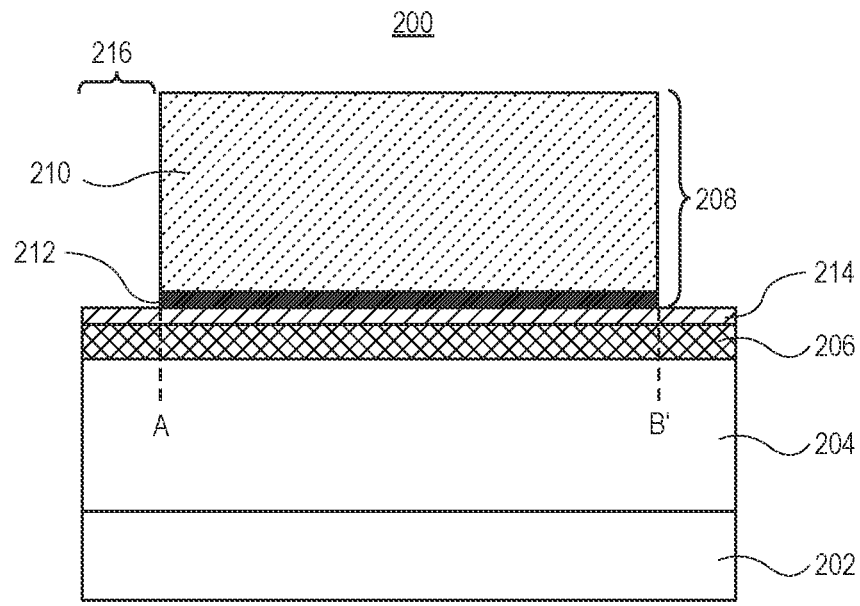
FIG. 2A illustrates a cross-sectional view taken along a gate "width" of a planar thin-film integrated circuit (IC) structure that can be included in an exclusion zone, in accordance with an embodiment of the present disclosure.

To provide a benchmark, FIG. 2A illustrates a cross-sectional view taken along a gate "width" of a planar thin film integrated circuit (IC) structure that can be included in an exclusion zone, in accordance with an embodiment of the present disclosure.

Referring to FIG. 2A, a planar TFT 200 is formed above a substrate 202, e.g., on an insulating layer 204 above a substrate, as is shown. The planar TFT 200 includes a channel material 206, such as a semiconducting oxide material. A gate electrode 208 is formed on a gate dielectric layer 214 formed on the channel material 206. The gate electrode 208 may include a fill material 210 on a workfunction layer 212, as is depicted. The gate electrode 208 may expose regions 216 of the channel material 206 and the gate dielectric layer 214, as is depicted. Alternatively, the channel material 206 and the gate dielectric layer 214 have a same lateral dimension as the gate electrode 208. It is to be appreciated that source/drain regions are into and out of the page of the view of FIG. 2A.

The planar TFT 200 has an effective gate width that is the length of the planar channel material 206 between locations A and B', as depicted in FIG. 2A. The TFT 200 may be referred to herein as a planar BEOL field effect transistor (FET).

Figure 2B:
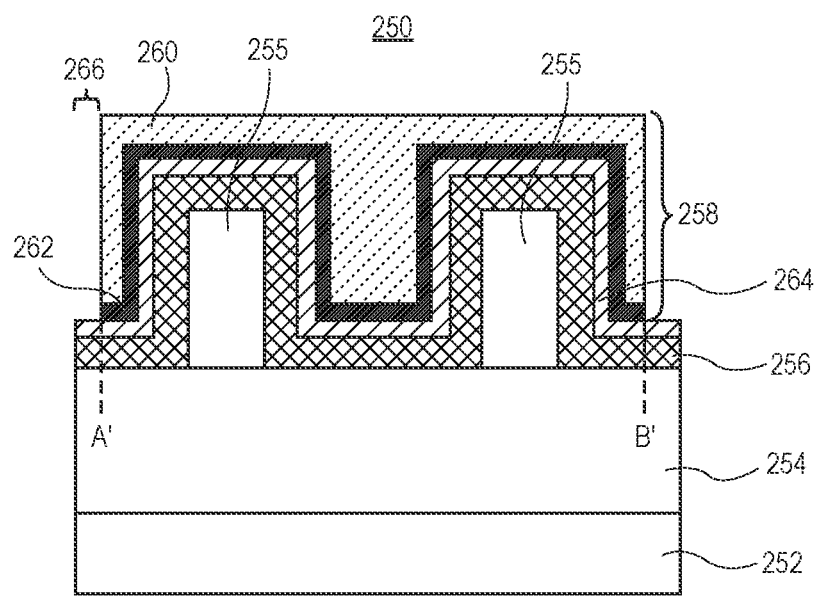
FIG. 2B illustrates a cross-sectional view taken along a gate "width" of a thin-film integrated circuit (IC) structure having relatively increased width and that can be included in an exclusion zone, in accordance with an embodiment of the present disclosure.

As a first example of a structure having relative increase in transistor width (e.g., relative to the structure of FIG. 2A), FIG. 2B illustrates a cross-sectional view taken along a gate "width" of a thin film IC structure having relatively increased width and that can be included in an exclusion zone, in accordance with an embodiment of the present disclosure.

Referring to FIG. 2B, a non-planar TFT 250 is formed above a substrate 252, e.g., on an insulating layer 254 above a substrate, as is shown. A pair of dielectric fins 255 is on the insulating layer 254. The non-planar TFT 250 includes a semiconducting oxide material 256, or similarly suitable channel material. The semiconducting oxide material 256 is conformal with the pair of dielectric fins 255 and with exposed portions of the insulating layer 254 between the pair of dielectric fins 255. A gate electrode 258 is formed on a gate dielectric layer 264 formed on the semiconducting oxide material 256. The gate electrode 258 may include a fill material 260 on a workfunction layer 262, as is depicted. The gate electrode 258 may expose regions 266 of the semiconducting oxide material 256 and the gate dielectric layer 264, as is depicted. Alternatively, the semiconducting oxide material 256 and the gate dielectric layer 264 have a same lateral dimension as the gate electrode 258. It is to be appreciated that source/drain regions are into and out of the page of the view of FIG. 2B.

The non-planar TFT 250 has an effective gate width that is the length of the conformal semiconducting oxide material 256 between locations A' and B', i.e., the full length including undulating portions over the tops and sidewalls of the dielectric fins 255, as is depicted in FIG. 2B. The TFT 250 may be referred to herein as a non-planar BEOL field effect transistor (FET). In comparison to FIG. 2A, the structure of FIG. 2B highlights the advantage of a non-planar architecture to increase effective gate width, referred to herein as a relatively increased width.

Figure 2C:
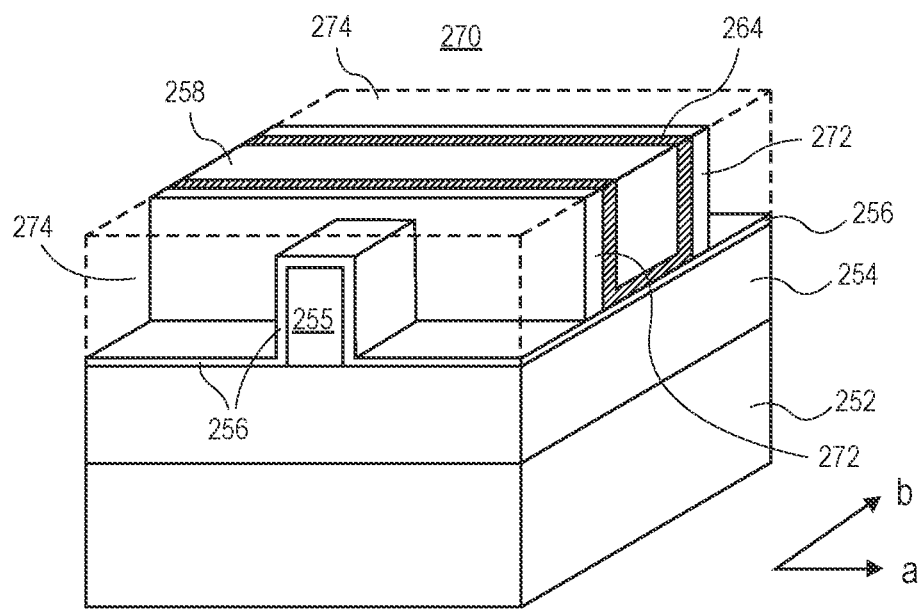
FIGS. 2C, 2D, and 2E illustrate angled and direct cross-sectional views of a thin-film integrated circuit (IC) structure having relatively increased width and that can be included in an exclusion zone, in accordance with an embodiment of the present disclosure.
Figure 2D:
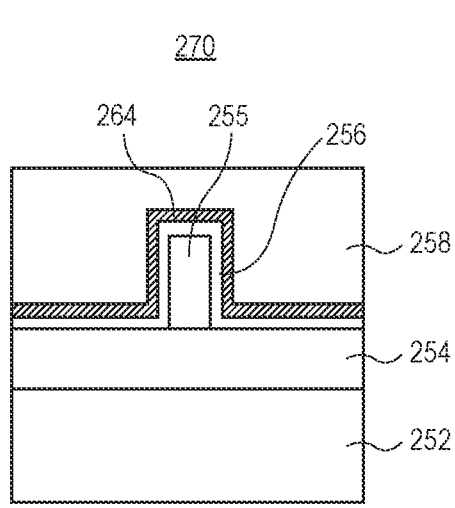
Figure 2E:
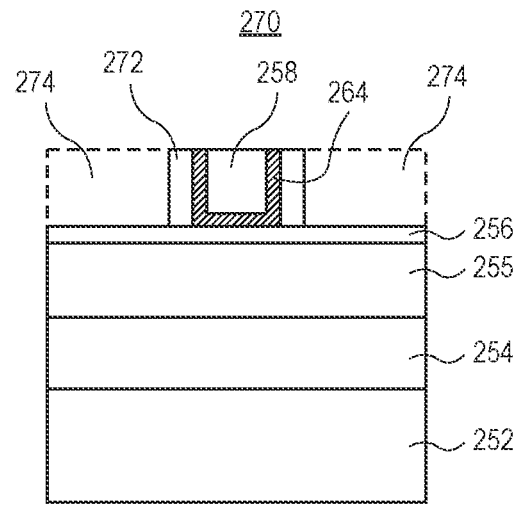

To highlight other aspects of a non-planar TFT topography, FIGS. 2C, 2D, and 2E illustrate angled and direct cross-sectional views of a thin film integrated circuit (IC) structure having relatively increased width and that can be included in an exclusion zone, in accordance with an embodiment of the present disclosure. It is to be appreciated that one dielectric fin is illustrated in FIGS. 2C-2E for simplification. Embodiments may include a single device fabricated over one (FIG. 2C), two (FIG. 2B) or more such dielectric fins.

Referring to FIGS. 2C-2E, an integrated circuit (IC) structure 270 includes a dielectric fin 255 on an insulator layer 254 above a substrate 252. The dielectric fin 255 has a top and sidewalls. A semiconducting oxide material 256, or similarly suitable channel material, is on the top and sidewalls of the dielectric fin 255. A gate electrode 258 is over a first portion of the semiconducting oxide material 256 on the top and sidewalls of the dielectric fin 255. The gate electrode 258 has a first side opposite a second side. A first conductive contact (left 274) is adjacent the first side of the gate electrode 258, over a second portion of the semiconducting oxide material 256 on the top and sidewalls of the dielectric fin 255. A second conductive contact (right 274) is adjacent the second side of the gate electrode 258, over a third portion of the semiconducting oxide material 256 on the top and sidewalls of the dielectric fin 255.

In an embodiment, the IC structure 270 further includes a gate dielectric layer 264 between the gate electrode 258 and the first portion of the semiconducting oxide material 256 on the top and sidewalls of the dielectric fin 255, as is depicted in FIGS. 2C-2E. In an embodiment, the IC structure 270 further includes a first dielectric spacer (left 272) between the first conductive contact 274 and the first side of the gate electrode 258, the first dielectric spacer 272 over a fourth portion of the semiconducting oxide material 256 on the top and sidewalls of the dielectric fin 255. A second dielectric spacer (right 272) is between the second conductive contact 274 and the second side of the gate electrode 258, the second dielectric spacer 272 over a fifth portion of the second semiconducting oxide material 256 on the top and sidewalls of the dielectric fin 255, as is depicted in FIGS. 2C and 2E. In one such embodiment, the gate dielectric layer 264 is further along the first and second dielectric spacers 272, as is also depicted in FIGS. 2C and 2E.

Referring collectively to FIGS. 2B-2E, in accordance with an embodiment of the present disclosure, an integrated circuit (IC) structure 250 or 270 includes an insulator structure 255 above a substrate 252. The insulator structure 255 has a topography that varies along a plane (ab) parallel with a global plane of the substrate 252. A semiconducting oxide material 256 is on the insulator structure 255. The semiconducting oxide material 256 is conformal with the topography of the insulator structure 255. A gate electrode 258 is over a first portion of the semiconducting oxide material 256 on the insulator structure 255. The gate electrode 258 has a first side opposite a second side. A first conductive contact (left 274) is adjacent the first side of the gate electrode 258. The first conductive contact 274 is over a second portion of the semiconducting oxide material 256 on the insulator structure 255. A second conductive contact (right 274) is adjacent the second side of the gate electrode 258. The second conductive contact 274 is over a third portion of the semiconducting oxide material 256 on the insulator structure 255.

In an embodiment, the insulator structure 250 or 270 includes one or more fins 255. Individual ones of the fins 255 have a top and sidewalls. The semiconducting oxide material 256 is on the top and sidewalls of the individual ones of the fins 255. In an embodiment, the insulator structure 255 (such as fin or fins 255) is composed of a dielectric material such as, but not limited to, silicon dioxide, silicon oxy-nitride, silicon nitride, or carbon-doped silicon nitride. In an embodiment, the insulator structure 255 is composed of a low-k dielectric material.

In an embodiment, dielectric fins described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have dielectric fins spaced at a constant pitch and having a constant width. The pattern may be fabricated by a pitch halving or pitch quartering, or other pitch division, approach. In an embodiment, the dielectric fin or fins 255 each have squared-off (as shown) or rounder corners.

In an embodiment, a gate dielectric layer 264 is between the gate electrode 258 and the first portion of the semiconducting oxide material 256 on the insulator structure 255, as is depicted. In one such embodiment, the gate dielectric layer 264 includes a layer of a high-k dielectric material directly on the semiconducting oxide material 256.

In an embodiment, a first dielectric spacer (first 272) is between the first conductive contact (first 274) and the first side of the gate electrode 258, the first dielectric spacer (first 272) over a fourth portion of the semiconducting oxide material 256 on the insulator structure 255. A second dielectric spacer (second 272) is between the second conductive contact (second 274) and the second side of the gate electrode 258, the second dielectric spacer (second 272) over a fifth portion of the semiconducting oxide material 256 on the insulator structure 255. In one such embodiment, a gate dielectric layer 264 is between the gate electrode 258 and the first portion of the semiconducting oxide material 256 on the insulator structure 255. The gate dielectric layer 264 is further along the first dielectric spacer (first 272) and the second dielectric spacer (second 272). In a specific such embodiment, the gate dielectric layer 264 includes a layer of a high-k dielectric material directly on the semiconducting oxide material 256.

In an embodiment, the semiconducting oxide material 256 includes indium gallium zinc oxide (IGZO). In an embodiment, the semiconducting oxide material 256 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 264 includes a layer of a high-k dielectric material directly on the semiconducting oxide material 256. In an alternative embodiment, the channel material is not a semiconducting oxide material but is rather a layer of polycrystalline silicon.

Figure 3A:
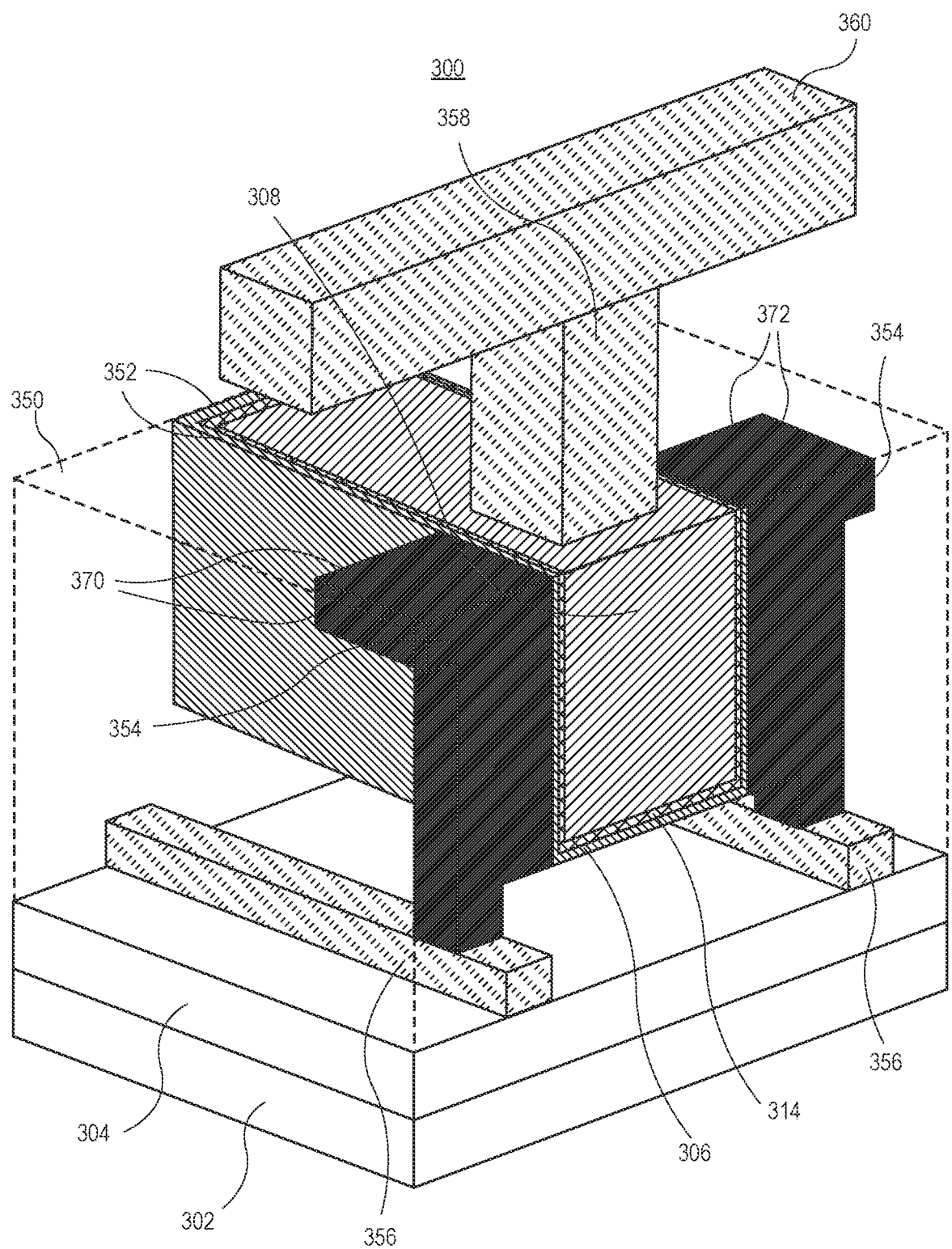
FIG. 3A illustrates an angled three-dimensional view of another thin-film integrated circuit (IC) structure having relatively increased width and that can be included in an exclusion zone, in accordance with another embodiment of the present disclosure.
Figure 3B:
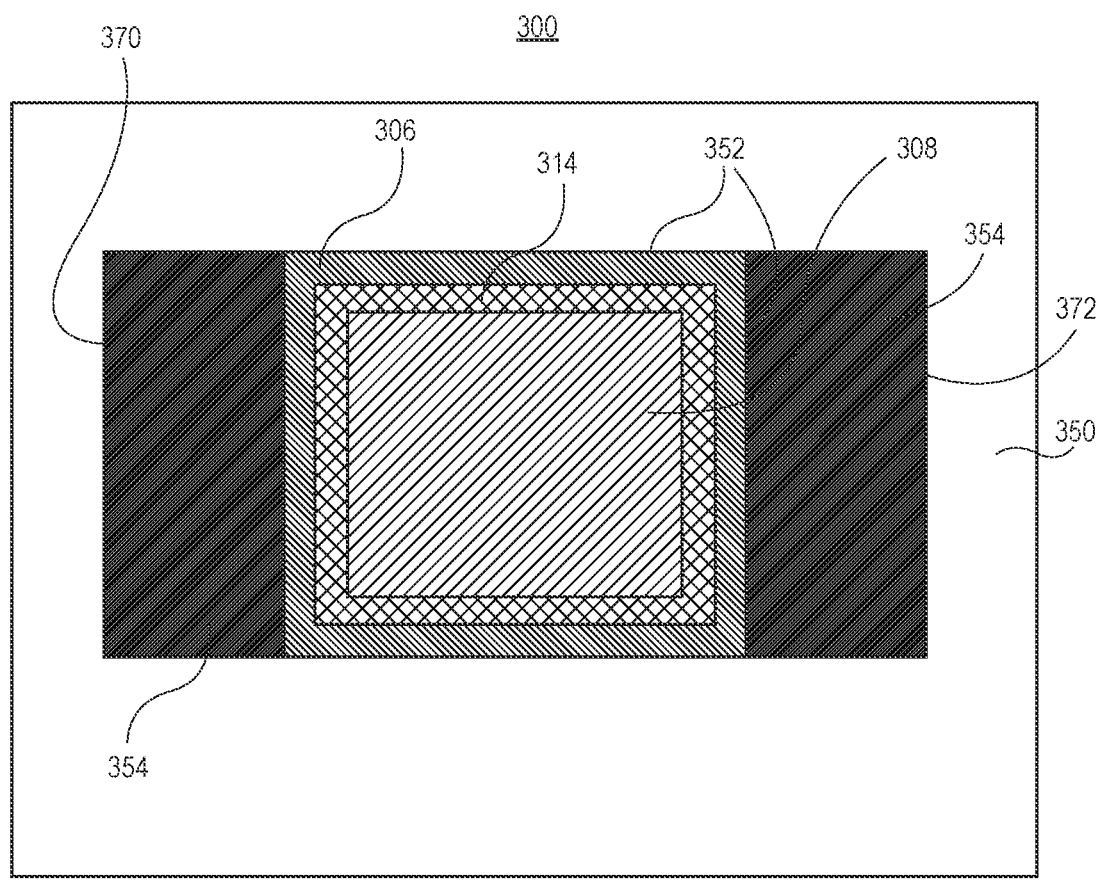
FIG. 3B illustrates a top-down view of a portion of the thin-film integrated circuit (IC) structure of FIG. 3A, in accordance with another embodiment of the present disclosure.

As a second example of a structure having relative increase in transistor width, FIG. 3A illustrates an angled three-dimensional view of another thin film integrated circuit (IC) structure having relatively increased width and that can be included in an exclusion zone, in accordance with another embodiment of the present disclosure. FIG. 3B illustrates a top-down view of a portion of the thin film IC structure of FIG. 3A.

Referring to FIGS. 3A and 3B, an integrated circuit structure 300 includes an insulator structure 350 above a substrate 302. The insulator structure 350 may be formed on an insulator layer 304, as is depicted. The insulator structure 350 has a first trench 352 therein, the first trench 352 having sidewalls and a bottom. A semiconducting oxide material 306, or similarly suitable channel material, is in the first trench 352 in the insulator structure 350. The semiconducting oxide material 306 is conformal with the sidewalls and bottom of the first trench 352. A gate dielectric layer 314 is on the semiconducting oxide material 306 in the first trench 352. The gate dielectric layer 314 is conformal with the semiconducting oxide material 306 conformal with the sidewalls and bottom of the first trench 352. A gate electrode 308 is on the gate dielectric layer 314 in the first trench 352. The gate electrode 308 has a first side opposite a second side and has an exposed top surface. A first conductive contact (left 354) is laterally adjacent the first side of the gate electrode 308. The first conductive contact (left 354) is on a first portion of the semiconducting oxide material 306 conformal with the sidewalls of the first trench 352. A second conductive contact (right 354) is laterally adjacent the second side of the gate electrode 308. The second conductive contact (right 354) is on a second portion of the semiconducting oxide material 306 conformal with the sidewalls of the first trench 352. It is to be appreciated that the conductive contacts 354 are shown only at the front portion of trench 352 for clarity of the drawing. In an embodiment, the conductive contacts 354 extend all the way, or substantially all the way along the trench 352 for maximized source/drain contact area and maintain a relatively small effective gate length.

In an embodiment, the insulator structure 350 is a single layer of inter-layer dielectric (ILD) material, as is depicted. In another embodiment, the insulator structure 350 is a stack of alternating dielectric layers, such as described in association with FIGS. 5A-5H.

In an embodiment, a third conductive contact 358 is over and in contact with the exposed top surface of the gate electrode 308, as is depicted. In an embodiment, the first conductive contact (left 354) is in a second trench 370 in the insulator structure 350, and the second conductive contact (right 354) is in a third trench 372 in the insulator structure 350, as is depicted. In an embodiment, the third conductive contact 358 is coupled to a conductive line 360, which may be a word line, as is depicted. In an embodiment, the first and second conductive contacts 354 are coupled corresponding conductive lines 356, as is depicted.

Referring again to FIG. 3A, in an embodiment, a non-planar back-end FET architecture uses the vertical length (depth) of the trench 352 to increase effective width of the transistor. That is, the depth of the trench 352 is the Z of the TFT, where the effective width (Weff) is relatively increased by setting Z to the depth of the trench.

In an embodiment, the semiconducting oxide material 306 includes indium gallium zinc oxide (IGZO). In an embodiment, the semiconducting oxide material 306 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 314 includes a layer of a high-k dielectric material directly on the semiconducting oxide material 306. In an alternative embodiment, the channel material is not a semiconducting oxide material but is rather a layer of polycrystalline silicon.

Figure 4:
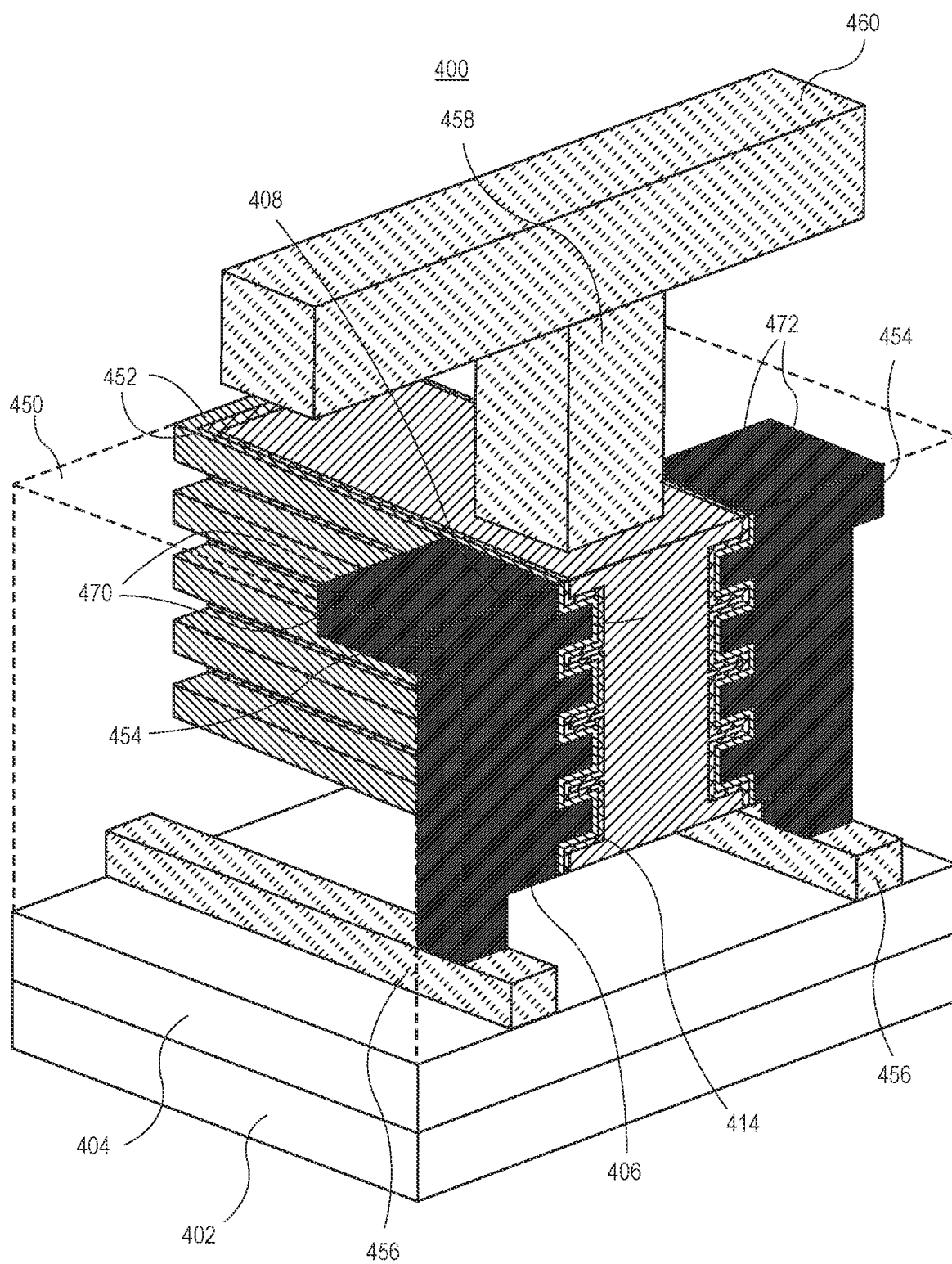
FIG. 4 illustrates an angled three-dimensional view of another thin-film integrated circuit (IC) structure having relatively increased width and that can be included in an exclusion zone, in accordance with another embodiment of the present disclosure.

As a third example of a structure having relative increase in transistor width, FIG. 4 illustrates an angled three-dimensional view of another thin film integrated circuit (IC) structure having relatively increased width and that can be included in an exclusion zone, in accordance with another embodiment of the present disclosure.

Referring to FIG. 4, an integrated circuit (IC) structure 400 includes an insulator structure 450 above a substrate 402. The insulator structure 450 may be formed on an insulator layer 404, as is depicted. The insulator structure 450 has a first trench 452 therein, the first trench 452 having sidewalls and a bottom. The insulator structure 450 has a topography that varies along a plane normal with a global plane of the substrate 402. In one such embodiment, the insulator structure 450 has a corrugated topography that varies along a plane normal with a global plane of the substrate 402, as is depicted. In a specific such embodiment, the corrugated topography is within a single layer of ILD material, as is depicted. In another specific such embodiment, the corrugated topography is within an arrangement of alternating dielectric layers, such as described in association with FIGS. 5A-5H.

A semiconducting oxide material 406, or similarly suitable channel material, is in the first trench 452 in the insulator structure 450. The semiconducting oxide material 406 is conformal with the sidewalls and bottom of the first trench 452, i.e., conformal with the topography of the insulator structure 450. A gate dielectric layer 414 is on the semiconducting oxide material 406 in the first trench 452. The gate dielectric layer 414 is conformal with the semiconducting oxide material 406 conformal with the sidewalls and bottom of the first trench 452. A gate electrode 408 is on the gate dielectric layer 414 in the first trench 452. The gate electrode 408 has a first side opposite a second side and has an exposed top surface. A first conductive contact (left 454) is laterally adjacent the first side of the gate electrode 408. The first conductive contact (left 454) is on a first portion of the semiconducting oxide material 406 conformal with the sidewalls of the first trench 452. A second conductive contact (right 454) is laterally adjacent the second side of the gate electrode 408. The second conductive contact (right 454) is on a second portion of the semiconducting oxide material 406 conformal with the sidewalls of the first trench 452. In an embodiment, the conductive contacts 454 extend all the way, or substantially all the way along the trench 452 for maximized source/drain contact area and maintain a relatively small effective gate length.

In an embodiment, a third conductive contact 458 is over and in contact with the exposed top surface of the gate electrode 408, as is depicted. In an embodiment, the first conductive contact (left 454) is in a second trench 470 in the insulator structure 450, and the second conductive contact (right 454) is in a third trench 472 in the insulator structure 450, as is depicted. In an embodiment, the third conductive contact 458 is coupled to a conductive line 460, which may be a word line, as is depicted. In an embodiment, the first and second conductive contacts 454 are coupled corresponding conductive lines 456, as is depicted.

Referring again to FIG. 4, in an embodiment, a non-planar back-end FET architecture uses the vertical length (depth) of the trench 452, including the additional length provided by the corrugation, to increase effective width of the transistor. That is, the length of the corrugated trench 452 is the Z of the TFT, where the effective width (Weff) is relatively increased by setting Z to the depth or length along the corrugated trench 452.

In an embodiment, the semiconducting oxide material 406 includes indium gallium zinc oxide (IGZO). In an embodiment, the semiconducting oxide material 406 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 414 includes a layer of a high-k dielectric material directly on the semiconducting oxide material 406. In an alternative embodiment, the channel material is not a semiconducting oxide material but is rather a layer of polycrystalline silicon.

In accordance with an embodiment of the present disclosure, the above TFT non-planar architectures 250, 270, 300 and 400 provide for higher effective widths for a transistor for a scaled projected area. In an embodiment, the drive strength and performance of such transistors are improved over state-of-the-art planar BEOL transistors.

As an exemplary processing scheme, FIGS. 5A-5H illustrate cross-sectional and plan views of various stages in a method of fabricating a thin film integrated circuit (IC) structure having relatively increased width and that can be included in an exclusion zone, in accordance with an embodiment of the present disclosure.

Figure 5A:
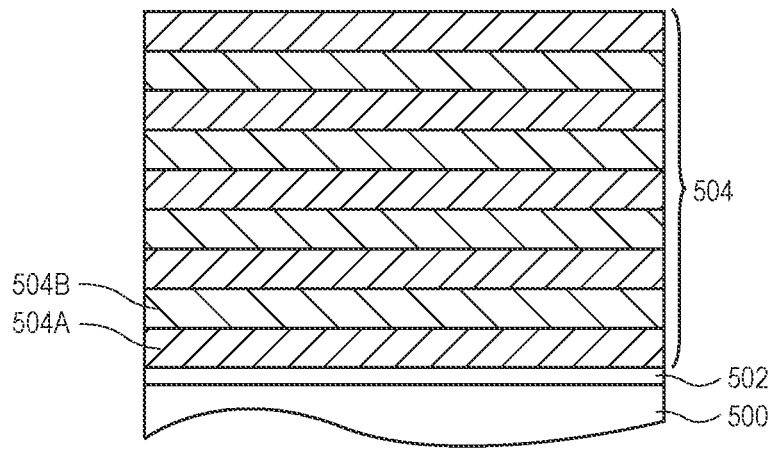
FIGS. 5A-5H illustrate cross-sectional and plan views of various stages in a method of fabricating a thin-film integrated circuit (IC) structure having relatively increased width and that can be included in an exclusion zone, in accordance with an embodiment of the present disclosure.

Referring to FIG. 5A, a stack 504 of dielectric layers is formed above a substrate 500 and, possibly, on an insulating layer 502 formed on or above the substrate 500. The stack 504 of dielectric layers includes alternating dielectric layers 504A and 504B of differing composition. In one embodiment, the stack 504 of dielectric layers is a stack of alternating silicon dioxide and silicon nitride layers.

Figure 5B:
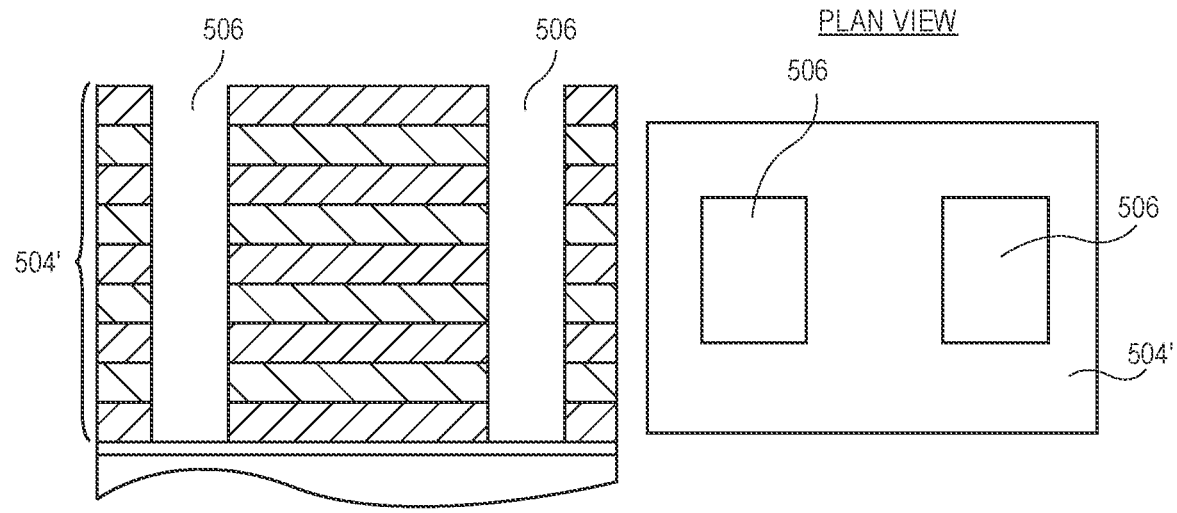

Referring to FIG. 5B, openings 506 are formed in the stack 504 of dielectric layers to form a once-patterned stack 504' of dielectric layers. In one embodiment, the structure of FIG. 5B is used without the process described below in association with FIG. 5C in order to arrive at a structure such as TFT 300.

Figure 5C:
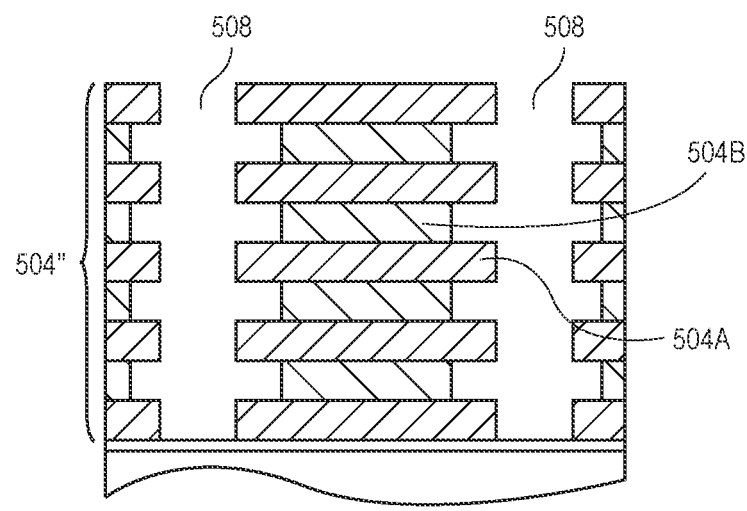

Referring to FIG. 5C, corrugation is achieved to form corrugated openings 508 by exposing the structure of FIG. 5B to an etch process that recesses layers 504B selective to layers 504A. The selective etching process provides twice-patterned stack 504" of dielectric layers. The twice-patterned stack 504" of dielectric layers may be used in order to arrive at a structure such as TFT 400.

Figure 5D:
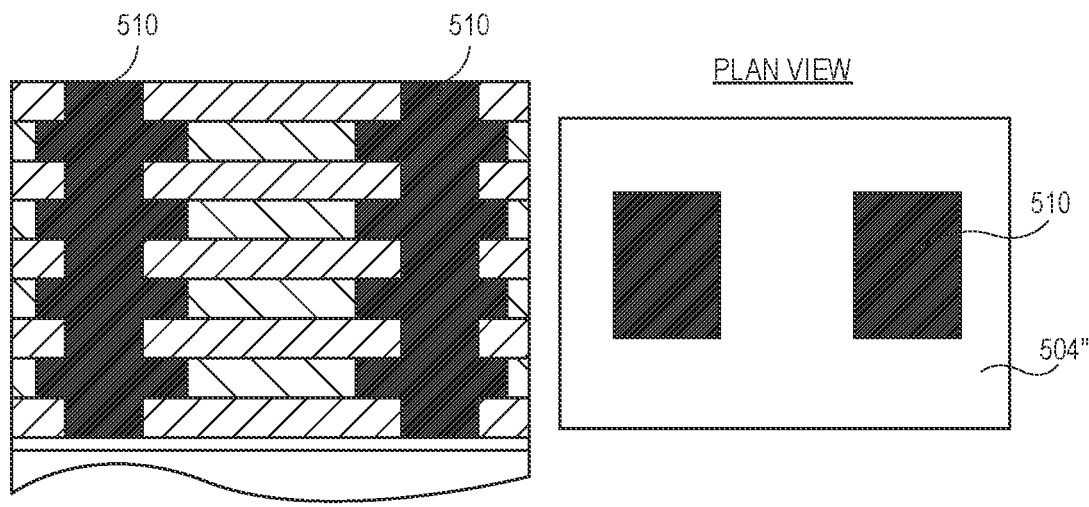

Referring to FIG. 5D, conductive contacts 510, such as source/drain contacts, are formed in the openings 508 of the structure of FIG. 5C. Conductive contacts may be formed, e.g., by a deposition or growth process.

Figure 5E:
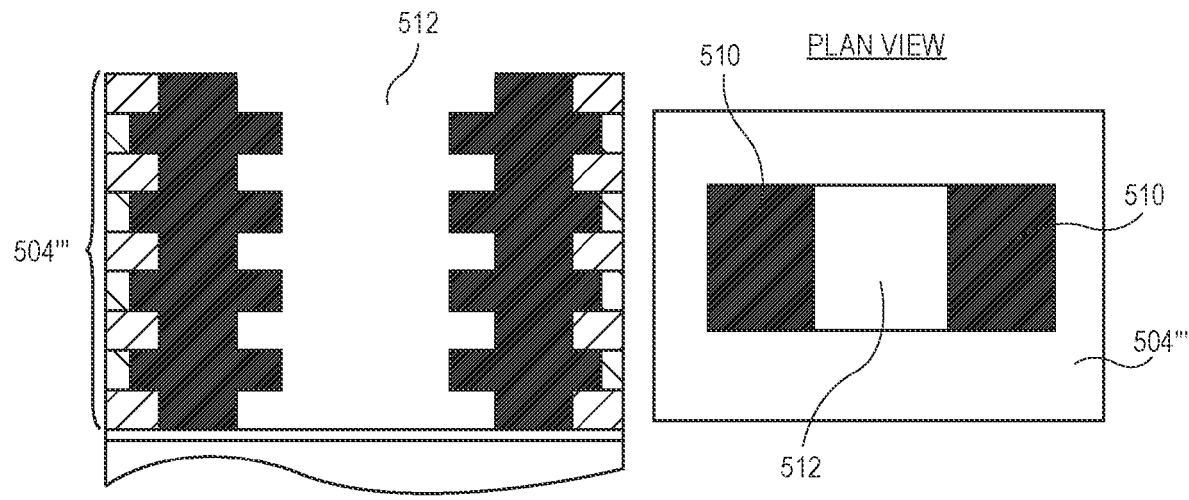

Referring to FIG. 5E, an opening 512 is formed between the conductive contacts 510 to form thrice-patterned stack 504''' of dielectric layers. The opening 512 exposes a corrugated surface of the conductive contacts 510.

Figure 5F:
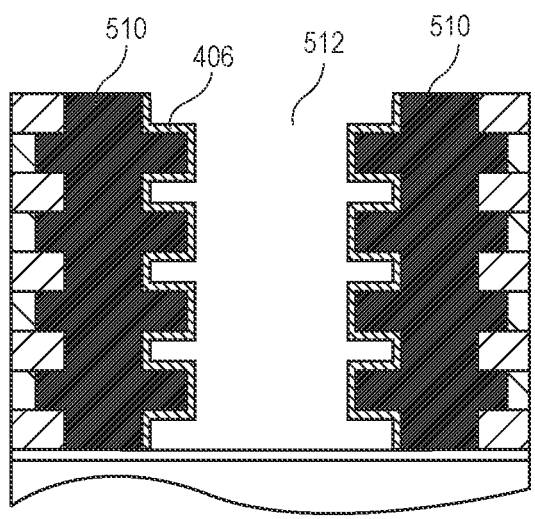

Referring to FIG. 5F, a semiconducting oxide layer 406, or other suitable channel material, is formed in opening 512 along the exposed surfaces of the conductive contacts 510. In an embodiment, the semiconducting oxide layer 406 is formed conformal with the corrugated surface of the conductive contacts 510, as is depicted.

Figure 5G:
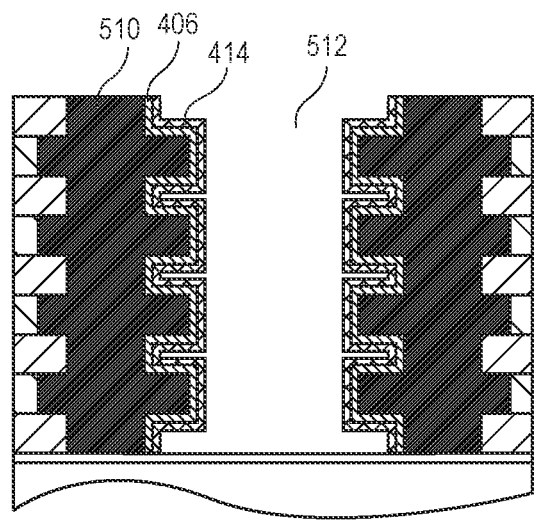

Referring to FIG. 5G, a gate dielectric layer 414 is formed in opening 512. The gate dielectric layer 414 is on and conformal with the semiconducting oxide layer 406.

Figure 5H:
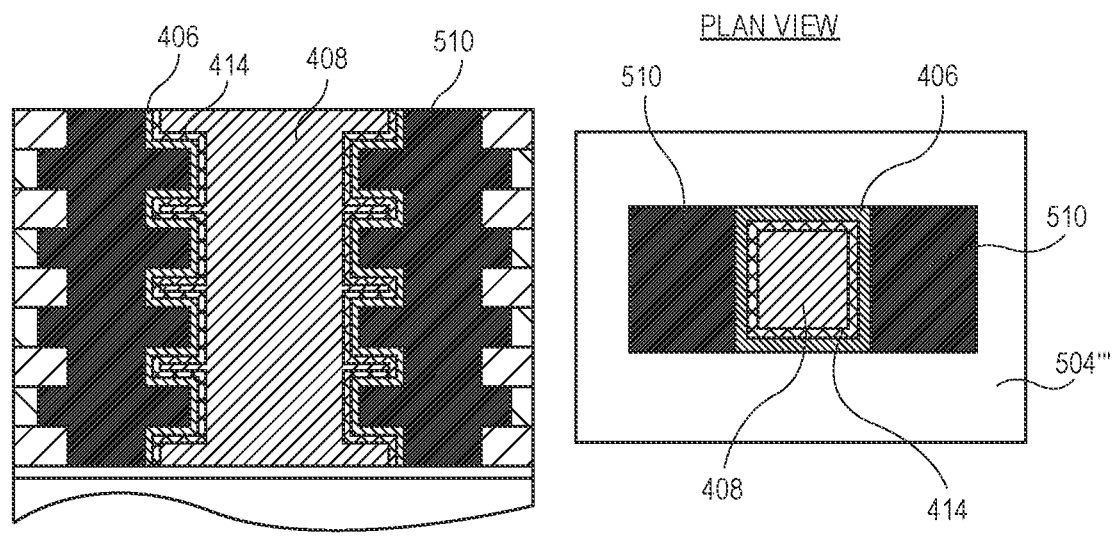

Referring to FIG. 5H, a gate electrode 408 is formed within opening 512. The gate electrode 408 is on and conformal with the gate dielectric layer 414. The structure of FIG. 5G may be included as a portion of the TFT 400 described in association with FIG. 4.

It is to be appreciated that the layers and materials described in association with embodiments herein are typically formed on or above an underlying semiconductor substrate 202, 252, 302, 402, 500, e.g., as FEOL layer(s). In other embodiments, the layers and materials described in association with embodiments herein are typically formed on or above underlying device layer(s) of an integrated circuit (IC), e.g., as BEOL layer(s) above an underlying semiconductor substrate 202, 252, 302, 402, 500. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon-on-insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level BEOL interconnect layers.

In the case that an insulator layer 254, 304, 404 or 502 is optionally used, the insulator layer 254, 304, 404 or 502 may be composed of a material suitable to ultimately electrically isolate, or contribute to the isolation of, portions of a gate structure from an underlying bulk substrate or interconnect layer. For example, in one embodiment, the insulator layer 254, 304, 404 or 502 is composed of a dielectric material such as, but not limited to, silicon dioxide, silicon oxynitride, silicon nitride, or carbon-doped silicon nitride. In a particular embodiment, the insulator layer 254, 304, 404 or 502 is a low-k dielectric layer of an underlying BEOL layer.

In an embodiment, the semiconducting oxide material 206, 256, 306 or 406 and, hence, channel material of a TFT includes an IGZO layer that has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO. In another embodiment, the semiconducting oxide material 206, 256, 306 or 406 is or includes a material such as tin oxide, antimony oxide, indium oxide, indium tin oxide, titanium oxide, zinc oxide, indium zinc oxide, gallium oxide, titanium oxynitride, ruthenium oxide, or tungsten oxide. In an alternative embodiment, polycrystalline silicon is used as the channel material instead of a semiconducting oxide material. In an embodiment, no matter the composition, the channel material has a thickness between 5 nanometers and 30 nanometers In an embodiment, the semiconducting oxide material 206, 256, 306 or 406 is an amorphous, crystalline, or semi crystalline oxide semiconductor, such as an amorphous, crystalline, or semi crystalline oxide semiconductor IGZO layer. The semiconducting oxide material 206, 256, 306 or 406 may be formed using a low-temperature deposition process, such as physical vapor deposition (PVD) (e.g., sputtering), atomic layer deposition (ALD), or chemical vapor deposition (CVD). The ability to deposit the semiconducting oxide material 206, 256, 306 or 406 at temperatures low enough to be compatible with back-end manufacturing processes represents a particular advantage. The semiconducting oxide material, 256, 306 or 406 may be deposited on sidewalls or conformably on any desired structure to a precise thickness, allowing the manufacture of transistors having any desired geometry.

In an embodiment, gate electrode 208, 258, 308 or 408 includes at least one P-type work function metal or N-type work function metal, depending on whether the integrated circuit device 200, 250, 270, 300 or 400 is to be included in a P-type transistor or an N-type transistor. For a P-type transistors, metals that may be used for the gate electrode 208, 258, 308 or 408 may include, but are not limited to, ruthenium, palladium, platinum, cobalt, nickel, and conductive metal oxides (e.g., ruthenium oxide). For an N-type transistor, metals that may be used for the gate electrode 208, 258, 308 or 408 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode 208, 258, 308 or 408 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layer 214, 264, 314 or 414 is composed of a high-k material. For example, in one embodiment, the gate dielectric layer 214, 264, 314 or 414 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric 214, 264, 314 or 414 may consist of a "U"-shaped structure that includes a bottom portion substantially parallel to the surface of the substrate and two sidewall portions that are substantially perpendicular to the top surface of the substrate, as is depicted in FIGS. 2C and 2E.

In some embodiments, the semiconducting oxide material 206, 256, 306 or 406 is in contact with the gate dielectric layer 214, 264, 314 or 414, respectively, an arrangement which may put an IGZO layer in contact with a high-k metal oxide layer. In other embodiments, an intermediate material is disposed between the semiconducting oxide material 206, 256, 306 or 406 and the gate dielectric layer 214, 264, 314 or 414. In some embodiments, an IGZO layer includes multiple regions of IGZO having different material properties. For example, an IGZO layer may include low indium content IGZO close to (e.g., in contact with) a high-k gate dielectric layer, and a high indium content IGZO close to (e.g., in contact with) the higher mobility semiconducting oxide channel material. High indium content IGZO may provide higher mobility and poorer interface properties relative to low indium content IGZO, while low indium content IGZO may provide a wider band gap, lower gate leakage, and better interface properties, although a lower mobility, relative to high indium content IGZO.

In an embodiment, dielectric spacers 272 are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode 258.

In an embodiment, conductive contacts 274, 354 or 454 act as contacts to source/drain regions of a TFT, or act directly as source/drain regions of the TFT. The conductive contacts 274, 354 or 454 may be spaced apart by a distance that is the gate length of the transistor 200, 250, 270, 300 or 400. In an embodiment, conductive contacts 358 or 458 directly contact a gate electrode. In some embodiments, the gate length is between 7 and 30 nanometers. In an embodiment, the conductive contacts 274, 354, 358, 454 or 458 include one or more layers of metal and/or metal alloys, examples of which are described above.

In an embodiment, interconnect lines (and, possibly, underlying or overlying via structures), such as interconnect lines 356, 360, 456 or 460, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein, such as ILD materials 350 or 450, are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer, e.g., gate electrode 208, 258, 308 or 408 and gate dielectric layer 214, 264, 314 or 414 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, the performance of a thin-film transistor (TFT) may depend on the carrier mobility of the components in the TFT. For example, a material with a higher carrier mobility enables carriers to move more quickly in response to a given electric field than a material with a lower carrier mobility. Accordingly, high carrier mobilities may be associated with improved performance. Although shown and described above as single semiconducting oxide layers, in accordance with embodiments described herein, a layer of a semiconducting oxide, such as a layer of IGZO, is between a high-k gate dielectric material and a higher mobility semiconducting oxide channel material. Although IGZO has a relatively low mobility (approximately 10 $cm^2$/V-s), the sub threshold swing of IGZO may be close to the conventional theoretical lower limit. In some embodiments, a thin layer of IGZO may directly border a channel material of choice, and may be sandwiched between the channel material and the high-k dielectric. The use of IGZO at the interface between the gate stack and the channel may achieve one or more of a number of advantages. For example, an IGZO interface may have a relatively small number of interface traps, defects at which carriers are trapped and released that impede performance. A TFT that includes an IGZO layer as a second semiconducting oxide material may exhibit desirably low gate leakage. When IGZO is used as an interface to a non-IGZO semiconducting oxide channel material (e.g., a thin film oxide semiconductor material having a higher mobility than IGZO), the benefits of the higher mobility channel material may be realized simultaneously with the good gate oxide interface properties provided by the IGZO. In accordance with one or more embodiments described herein, a gate-channel arrangement based on a dual semiconducting oxide layer channel enables the use of a wider array of thin film transistor channel materials, while achieving desirable gate control, than realizable using conventional approaches.

In an embodiment, the addition of a second thin film semiconductor around a first TFT material can provide one or more of mobility enhancement, improved short channel effects (SCEs) particularly if all conduction occurs in the second material. The second TFT material may be selected for strong oxygen bond capability in order to stabilize the TFT when exposed to downstream processing. In accordance with one embodiment, a higher mobility semiconducting oxide material is effectively wrapped in a lower mobility material semiconducting oxide that is more oxygen stable. The resulting structure may limit the negative effects of downstream high temperature processing operations or aggressive operations on the inner TFT material by having the highly stable outer material. An increased set of materials that can be chosen to maximize stability and mobility simultaneously may be achieved using such a dual material architecture.

In another aspect, the integrated circuit (IC) structures described herein may be included in an electronic device. As a first example of an apparatus that may include one or more of the TFTs disclosed herein, FIGS. 6A and 6B are top views of a wafer and dies that include one or more thin film transistors having in an exclusion zone, in accordance with any of the embodiments disclosed herein.

Figure 6B:
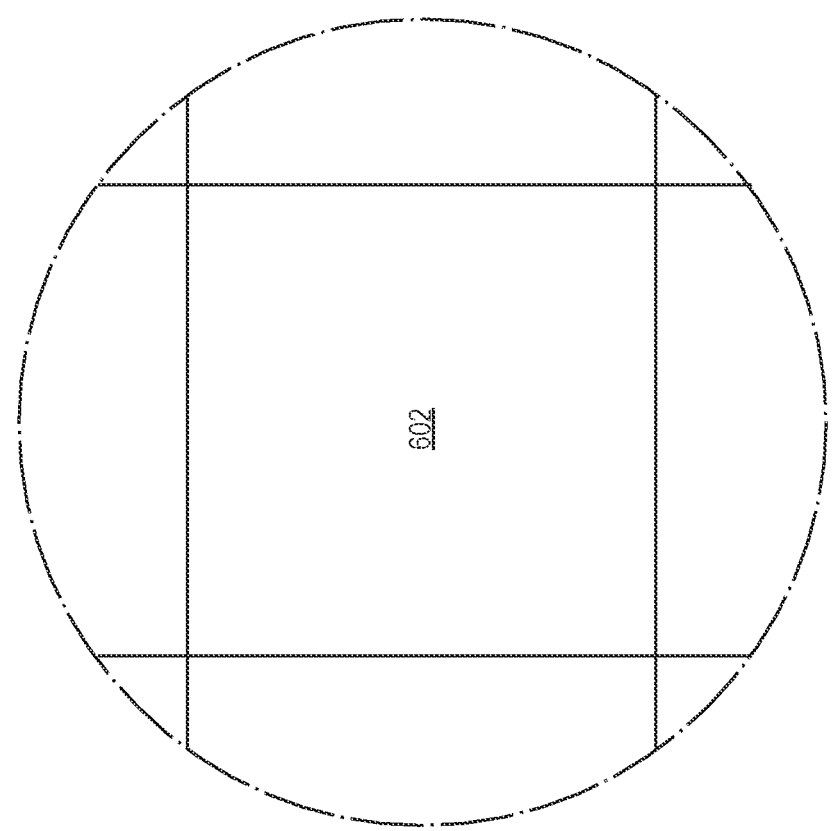
FIGS. 6A and 6B are top views of a wafer and dies that include one or more (TFTs) in an exclusion zone, in accordance with one or more of the embodiments disclosed herein.
Figure 6A:
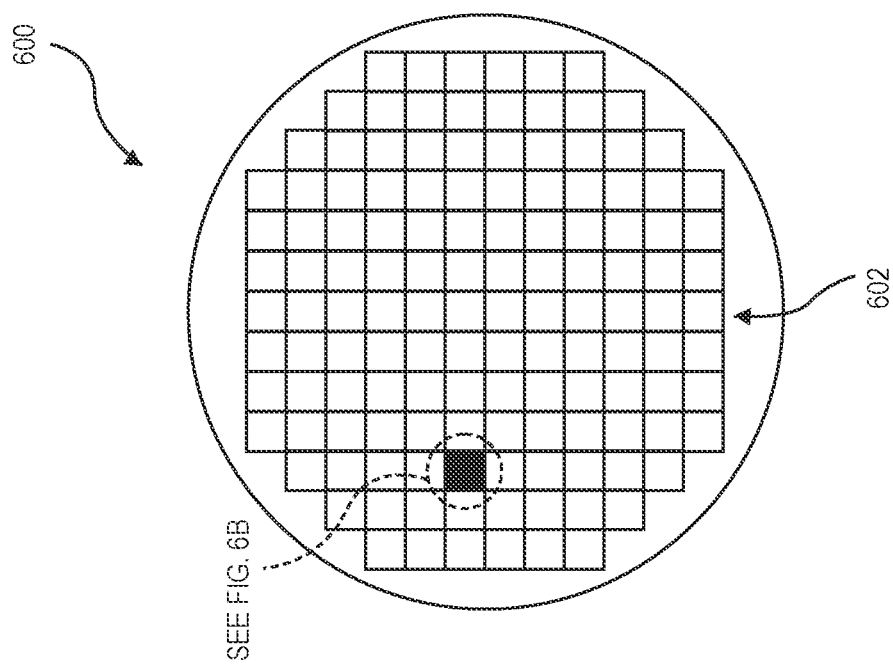

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more structures such as structures 200, 250, 270, 300 or 400). After the fabrication of the semiconductor product is complete (e.g., after manufacture of structures 200, 250, 270, 300 or 400), the wafer 600 may undergo a singulation process in which each of the dies 602 is separated from one another to provide discrete "chips" of the semiconductor product. In particular, devices that include TFT as disclosed herein may take the form of the wafer 600 (e.g., not singulated) or the form of the die 602 (e.g., singulated). The die 602 may include one or more transistors and/or supporting circuitry to route electrical signals to the transistors, as well as any other IC components. In some embodiments, the wafer 600 or the die 602 may include a memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Figure 7:
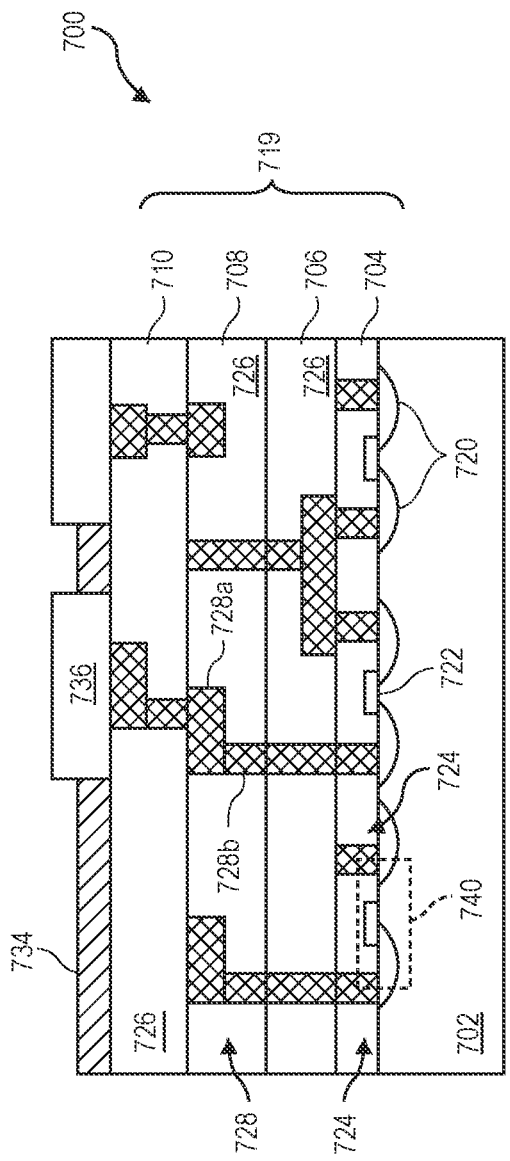
FIG. 7 is a cross-sectional side view of an integrated circuit (IC) device that may include one or more TFTs in an exclusion zone, in accordance with one or more of the embodiments disclosed herein.

FIG. 7 is a cross-sectional side view of an integrated circuit (IC) device that may include one or more thin film transistors in an exclusion zone, in accordance with one or more of the embodiments disclosed herein.

Referring to FIG. 7, an IC device 700 is formed on a substrate 702 (e.g., the wafer 600 of FIG. 6A) and may be included in a die (e.g., the die 602 of FIG. 6B), which may be singulated or included in a wafer. Although a few examples of materials from which the substrate 702 may be formed are described above in association with substrate 202, 252, 302, 402, 500, any material that may serve as a foundation for an IC device 700 may be used.

The IC device 700 may include one or more device layers, such as device layer 704, disposed on the substrate 702. The device layer 704 may include features of one or more transistors 740 formed on the substrate 702. The device layer 704 may include, for example, one or more source and/or drain (S/D) regions 720, a gate 722 to control current flow in the transistors 740 between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In an embodiment, one or more of the TFT transistors 200, 250, 270, 300 or 400 is included in an exclusion zone. In one such embodiment, a TFT transistor is in a location that excludes transistors 740 and, in a particular embodiment, is proximate a through-silicon via. Thin-film transistors such as 200, 250, 270, 300 or 400 may be particularly advantageous when used in the metal layers of a microprocessor device for embedded dynamic random access memory (DRAM) circuitry, analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 740 of the device layer 704 through one or more interconnect layers disposed on the device layer 704 (illustrated in FIG. 7 as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form an interlayer dielectric (ILD) stack 719 of the IC device 700.

The interconnect structures 728 may be arranged within the interconnect layers 706-710 to route electrical signals according to a wide variety of designs (in particular, the arrangement is not limited to the particular configuration of interconnect structures 728 depicted in FIG. 7). Although a particular number of interconnect layers 706-710 is depicted in FIG. 7, embodiments of the present disclosure include IC devices having more or fewer interconnect layers than depicted.

In some embodiments, the interconnect structures 728 may include trench structures 728a (sometimes referred to as "lines") and/or via structures 728b filled with an electrically conductive material such as a metal. The trench structures 728a may be arranged to route electrical signals in a direction of a plane that is substantially parallel with a surface of the substrate 702 upon which the device layer 704 is formed. For example, the trench structures 728a may route electrical signals in a direction in and out of the page from the perspective of FIG. 7. The via structures 728b may be arranged to route electrical signals in a direction of a plane that is substantially perpendicular to the surface of the substrate 702 upon which the device layer 704 is formed. In some embodiments, the via structures 728b may electrically couple trench structures 728a of different interconnect layers 706-710 together.

The interconnect layers 706-710 may include a dielectric material 726 disposed between the interconnect structures 728, as shown in FIG. 7. In some embodiments, the dielectric material 726 disposed between the interconnect structures 728 in different ones of the interconnect layers 706-710 may have different compositions; in other embodiments, the composition of the dielectric material 726 between different interconnect layers 706-710 may be the same. In either case, such dielectric materials may be referred to as inter-layer dielectric (ILD) materials.

A first interconnect layer 706 (referred to as Metal 1 or "M1") may be formed directly on the device layer 704. In some embodiments, the first interconnect layer 706 may include trench structures 728a and/or via structures 728b, as shown. The trench structures 728a of the first interconnect layer 706 may be coupled with contacts (e.g., the S/D contacts 724) of the device layer 704.

A second interconnect layer 708 (referred to as Metal 2 or "M2") may be formed directly on the first interconnect layer 706. In some embodiments, the second interconnect layer 708 may include via structures 728b to couple the trench structures 728a of the second interconnect layer 708 with the trench structures 728a of the first interconnect layer 706. Although the trench structures 728a and the via structures 728b are structurally delineated with a line within each interconnect layer (e.g., within the second interconnect layer 708) for the sake of clarity, the trench structures 728a and the via structures 728b may be structurally and/or materially contiguous (e.g., simultaneously filled during a dual-damascene process) in some embodiments.

A third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706.

The IC device 700 may include a solder resist material 734 (e.g., polyimide or similar material) and one or more bond pads 736 formed on the interconnect layers 706-710. The bond pads 736 may be electrically coupled with the interconnect structures 728 and configured to route the electrical signals of the transistor(s) 740 to other external devices. For example, solder bonds may be formed on the one or more bond pads 736 to mechanically and/or electrically couple a chip including the IC device 700 with another component (e.g., a circuit board). The IC device 700 may have other alternative configurations to route the electrical signals from the interconnect layers 706-710 than depicted in other embodiments. For example, the bond pads 736 may be replaced by or may further include other analogous features (e.g., posts) that route the electrical signals to external components.

Figure 8:
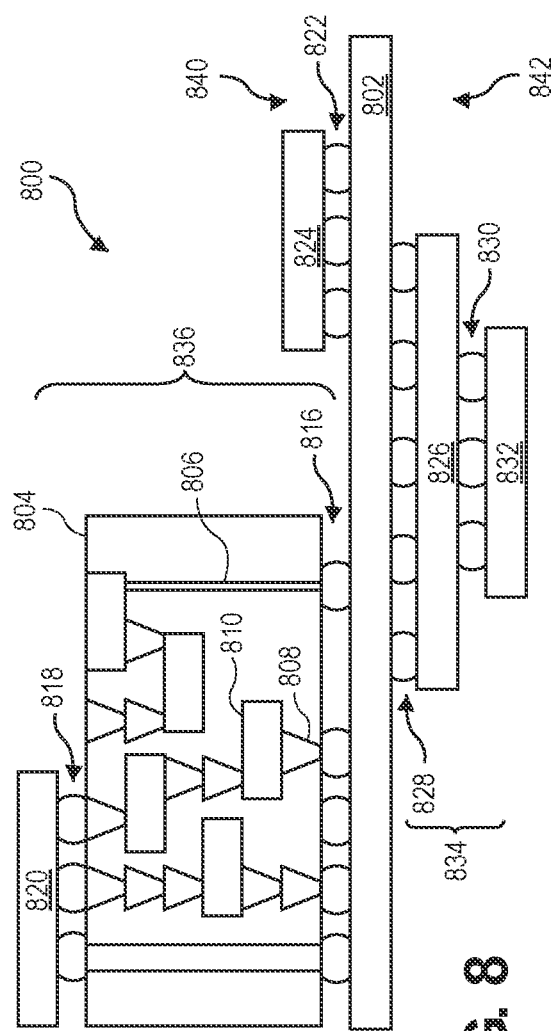
FIG. 8 is a cross-sectional side view of an integrated circuit (IC) device assembly that may include one or more TFTs having in an exclusion zone, in accordance with one or more of the embodiments disclosed herein.

FIG. 8 is a cross-sectional side view of an integrated circuit (IC) device assembly that may include one or more thin film transistors included in an exclusion zone, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of the TFT structures 200, 250, 270, 300 or 400 disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 602 of FIG. 6B), an IC device (e.g., the IC device 700 of FIG. 7), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
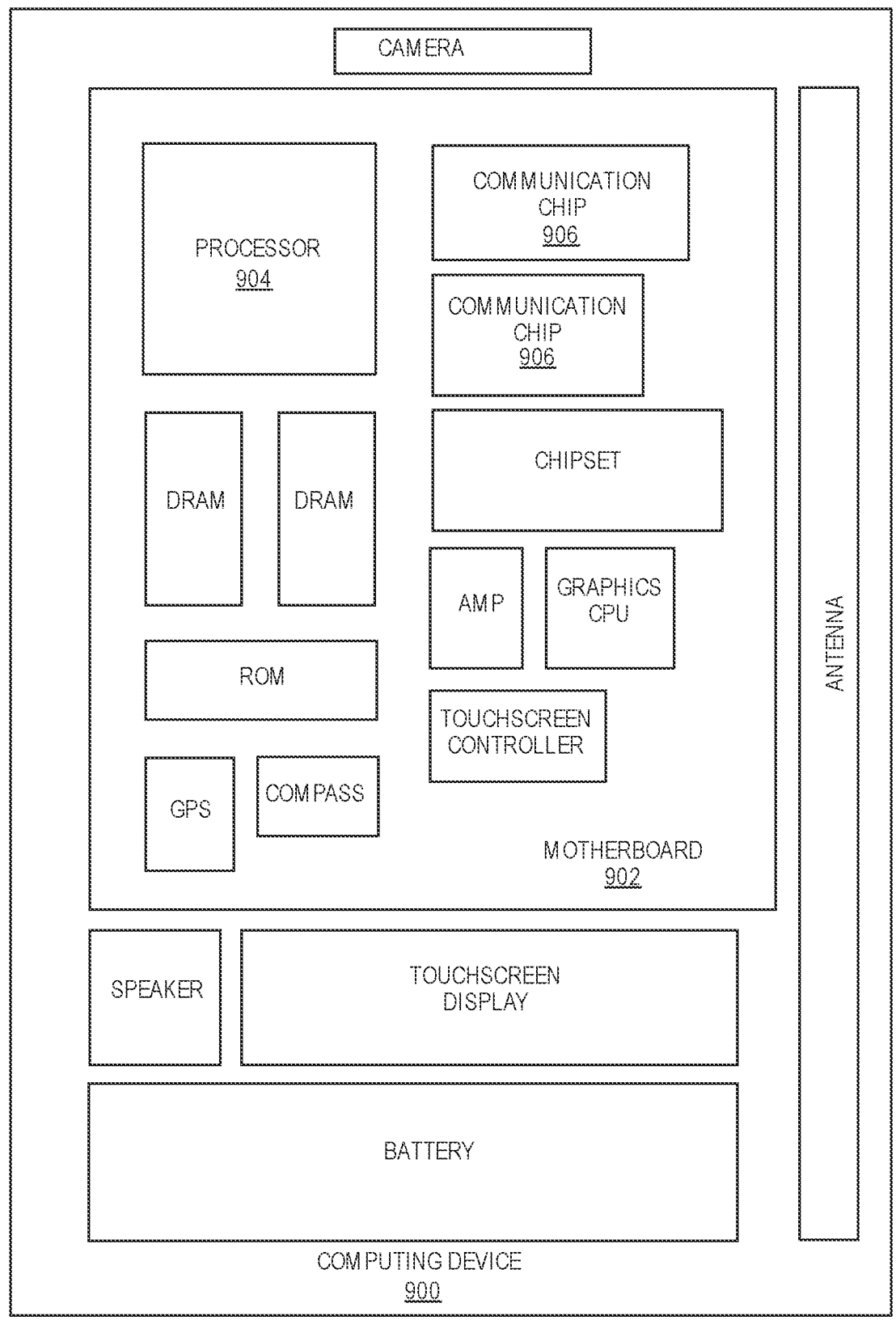
FIG. 9 illustrates a computing device in accordance with one implementation of an embodiment of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more thin-film transistors (TFTs) and/or one or more metal-insulator-metal (MIM) capacitors in an exclusion zone, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit (IC) die packaged within the communication chip 906. In accordance with another implementation of embodiments of the disclosure, the IC die of the communication chip includes one or more TFTs and/or one or more MIM capacitors in an exclusion zone, in accordance with implementations of embodiments of the disclosure.

In further implementations, another component housed within the computing device 900 may contain an integrated circuit die that includes one or more TFTs and/or one or more MIM capacitors in an exclusion zone, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include TFTs or MIM capacitors in exclusion zones, and methods of fabricating TFTs or MIM capacitors in exclusion zones.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit (IC) structure includes a semiconductor substrate having a zone with metal oxide semiconductor (MOS) transistors therein, and having a zone that excludes MOS transistors. A back-end-of-line (BEOL) structure is above the semiconductor substrate. A thin-film transistor (TFT) is in the BEOL structure. The TFT is vertically over the zone that excludes MOS transistors.

Example Embodiment 2

The integrated circuit structure of example embodiment 1, wherein the zone that excludes MOS transistors is a keep out zone (KOZ).

Example Embodiment 3

The integrated circuit structure of example embodiment 1 or 2, further including a through-silicon via (TSV) structure extending through the BEOL structure and the semiconductor substrate, the TSV structure in the zone that excludes MOS transistors.

Example Embodiment 4

The integrated circuit structure of example embodiment 3, wherein the TFT is laterally spaced apart from the TSV structure by a distance of 10 microns or less.

Example Embodiment 5

The integrated circuit structure of example embodiment 1, 2, 3 or 4, further including a metal-insulator-metal (MIM) capacitor in the back-end-of-line BEOL structure, the MIM capacitor coupled to the TFT.

Example Embodiment 6

An integrated circuit (IC) structure includes a semiconductor substrate having a zone with metal oxide semiconductor (MOS) transistors therein, and having a zone that excludes MOS transistors. A back-end-of-line (BEOL) structure is above the semiconductor substrate. A metal-insulator-metal (MIM) capacitor is in the BEOL structure. The MIM capacitor is vertically over the zone that excludes MOS transistors.

Example Embodiment 7

The integrated circuit structure of example embodiment 6, wherein the zone that excludes MOS transistors is a keep out zone (KOZ).

Example Embodiment 8

The integrated circuit structure of example embodiment 6 or 7, further including a through-silicon via (TSV) structure extending through the BEOL structure and the semiconductor substrate, the TSV structure in the zone that excludes MOS transistors.

Example Embodiment 9

The integrated circuit structure of example embodiment 8, wherein the MIM capacitor is laterally spaced apart from the TSV structure by a distance of 10 microns or less.

Example Embodiment 10

The integrated circuit structure of example embodiment 6, 7, 8 or 9, wherein the MIM capacitor has a cylindrical geometry.

Example Embodiment 11

A computing device includes a board, and a component coupled to the board. The component includes an integrated circuit structure including a semiconductor substrate having a zone with metal oxide semiconductor (MOS) transistors therein, and having a zone that excludes MOS transistors. A back-end-of-line (BEOL) structure is above the semiconductor substrate. A thin-film transistor (TFT) is in the BEOL structure. The TFT is vertically over the zone that excludes MOS transistors.

Example Embodiment 12

The computing device of example embodiment 11, further including a memory coupled to the board.

Example Embodiment 13

The computing device of example embodiment 11 or 12, further including a communication chip coupled to the board.

Example Embodiment 14

The computing device of example embodiment 11, 12 or 13, further including a camera coupled to the board.

Example Embodiment 15

The computing device of example embodiment 11, 12, 13 or 14, wherein the component is a packaged integrated circuit die.

Example Embodiment 16

A computing device includes a board, and a component coupled to the board. The component includes an integrated circuit structure including a semiconductor substrate having a zone with metal oxide semiconductor (MOS) transistors therein, and having a zone that excludes MOS transistors. A back-end-of-line (BEOL) structure is above the semiconductor substrate. A metal-insulator-metal (MIM) capacitor is in the BEOL structure. The MIM capacitor is vertically over the zone that excludes MOS transistors.

Example Embodiment 17

The computing device of example embodiment 16, further including a memory coupled to the board.

Example Embodiment 18

The computing device of example embodiment 16 or 17, further including a communication chip coupled to the board.

Example Embodiment 19

The computing device of example embodiment 16, 17 or 18, further including a camera coupled to the board.

Example Embodiment 20

The computing device of example embodiment 16, 17, 18 or 19, wherein the component is a packaged integrated circuit die.

What is claimed is:
1. An integrated circuit structure, comprising:
   a semiconductor substrate having a zone with metal oxide semiconductor (MOS) transistors therein, and having a zone that excludes MOS transistors;
   a back-end-of-line (BEOL) structure above the semiconductor substrate; and
   a first thin-film transistor (TFT) and a second TFT in the BEOL structure, the first TFT vertically over the zone that excludes MOS transistors, and the second TFT vertically over the zone with MOS transistors.
2. The integrated circuit structure of claim 1, wherein the zone that excludes MOS transistors is a keep out zone (KOZ).
3. The integrated circuit structure of claim 1, further comprising:
   a through-silicon via (TSV) structure extending through the BEOL structure and the semiconductor substrate, the TSV structure in the zone that excludes MOS transistors.
4. The integrated circuit structure of claim 3, wherein the first TFT is laterally spaced apart from the TSV structure by a distance of 10 microns or less.
5. The integrated circuit structure of claim 1, further comprising:
   a metal-insulator-metal (MIM) capacitor in the BEOL structure, the MIM capacitor coupled to the first TFT.
6. An integrated circuit structure, comprising:
   a semiconductor substrate having a zone with metal oxide semiconductor (MOS) transistors therein, and having a zone that excludes MOS transistors;
   a back-end-of-line (BEOL) structure above the semiconductor substrate; and
   a first metal-insulator-metal (MIM) capacitor and a second MIM capacitor in the BEOL structure, the first MIM capacitor vertically over the zone that excludes MOS transistors, and the second MIM capacitor vertically over the zone with MOS transistors.
7. The integrated circuit structure of claim 6, wherein the zone that excludes MOS transistors is a keep out zone (KOZ).
8. The integrated circuit structure of claim 6, further comprising:
   a through-silicon via (TSV) structure extending through the BEOL structure and the semiconductor substrate, the TSV structure in the zone that excludes MOS transistors.
9. The integrated circuit structure of claim 8, wherein the first MIM capacitor is laterally spaced apart from the TSV structure by a distance of 10 microns or less.

10. The integrated circuit structure of claim 6, wherein the first MIM capacitor has a cylindrical geometry.

11. A computing device, comprising:
a board; and
a component coupled to the board, the component including an integrated circuit structure, comprising:
a semiconductor substrate having a zone with metal oxide semiconductor (MOS) transistors therein, and having a zone that excludes MOS transistors;
a back-end-of-line (BEOL) structure above the semiconductor substrate; and
a first thin-film transistor (TFT) and a second TFT in the BEOL structure, the first TFT vertically over the zone that excludes MOS transistors, and the second TFT vertically over the zone with MOS transistors.

12. The computing device of claim 11, further comprising:
a memory coupled to the board.

13. The computing device of claim 11, further comprising:
a communication chip coupled to the board.

14. The computing device of claim 11, further comprising:
a camera coupled to the board.

15. The computing device of claim 11, wherein the component is a packaged integrated circuit die.

16. A computing device, comprising:
a board; and
a component coupled to the board, the component including an integrated circuit structure, comprising:
a semiconductor substrate having a zone with metal oxide semiconductor (MOS) transistors therein, and having a zone that excludes MOS transistors;
a back-end-of-line (BEOL) structure above the semiconductor substrate; and
a first metal-insulator-metal (MIM) capacitor and a second MIM capacitor in the BEOL structure, the first MIM capacitor vertically over the zone that excludes MOS transistors, and the second MIM capacitor vertically over the zone with MOS transistors.

17. The computing device of claim 16, further comprising:
a memory coupled to the board.

18. The computing device of claim 16, further comprising:
a communication chip coupled to the board.

19. The computing device of claim 16, further comprising:
a camera coupled to the board.

20. The computing device of claim 16, wherein the component is a packaged integrated circuit die.

21. An integrated circuit structure, comprising:
a semiconductor substrate having a zone with metal oxide semiconductor (MOS) transistors therein, and having a zone that excludes MOS transistors;
a back-end-of-line (BEOL) structure above the semiconductor substrate;
a thin-film transistor (TFT) in the BEOL structure, the TFT vertically over the zone that excludes MOS transistors; and
a through-silicon via (TSV) structure extending through the BEOL structure and the semiconductor substrate, the TSV structure in the zone that excludes MOS transistors.

22. The integrated circuit structure of claim 21, wherein the TFT is laterally spaced apart from the TSV structure by a distance of 10 microns or less.

23. An integrated circuit structure, comprising:
a semiconductor substrate having a zone with metal oxide semiconductor (MOS) transistors therein, and having a zone that excludes MOS transistors;
a back-end-of-line (BEOL) structure above the semiconductor substrate;
a metal-insulator-metal (MIM) capacitor in the BEOL structure, the first MIM capacitor vertically over the zone that excludes MOS transistors; and
a through-silicon via (TSV) structure extending through the BEOL structure and the semiconductor substrate, the TSV structure in the zone that excludes MOS transistors.

24. The integrated circuit structure of claim 23, wherein the MIM capacitor is laterally spaced apart from the TSV structure by a distance of 10 microns or less.

* * * * *